United States Patent
Inagaki et al.

(10) Patent No.: US 7,396,406 B2
(45) Date of Patent: *Jul. 8, 2008

(54) SINGLE CRYSTAL SEMICONDUCTOR MANUFACTURING APPARATUS AND METHOD

(75) Inventors: Hiroshi Inagaki, Kanagawa (JP); Masahiro Shibata, Kanagawa (JP); Shigeki Kawashima, Kanagawa (JP); Nobuyuki Fukuda, Kanagawa (JP)

(73) Assignee: Sumco Techxiv Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/588,533

(22) PCT Filed: Feb. 9, 2004

(86) PCT No.: PCT/JP2005/001937

§ 371 (c)(1),
(2), (4) Date: Aug. 7, 2006

(87) PCT Pub. No.: WO2005/075714

PCT Pub. Date: Aug. 18, 2005

(65) Prior Publication Data
US 2007/0157871 A1 Jul. 12, 2007

(30) Foreign Application Priority Data
Feb. 9, 2004 (JP) ............... 2004-032670

(51) Int. Cl.
*C30B 15/20* (2006.01)
(52) U.S. Cl. .............. 117/30; 117/13; 117/32; 117/917
(58) Field of Classification Search .......... 117/13, 117/30, 32, 917
See application file for complete search history.

(56) References Cited

U.S. PATENT DOCUMENTS

| 6,171,393 | B1 | 1/2001 | Kurosaka et al. |
| 6,506,251 | B1 | 1/2003 | Kitagawa et al. |
| 2005/0139149 | A1 | 6/2005 | Maeda et al. |

FOREIGN PATENT DOCUMENTS

| JP | 07-206583 | 8/1995 |
| JP | 09-249492 | 9/1997 |

(Continued)

*Primary Examiner*—Felisa C Hiteshew
(74) *Attorney, Agent, or Firm*—Welsh & Katz, Ltd.

(57) ABSTRACT

A single crystal semiconductor manufacturing method for realizing a dislocation-free single crystal while not varying or hardly varying electric power supplied to a heater when and after a seed crystal comes into contact with a melt. The allowable temperature difference ΔTc not causing dislocation in the seed crystal is determined according to the concentration (C) of the impurities added to the seed crystal (14) and the size (diameter D) of the seed crystal (14). When the seed crystal (14) comes into contact with the melt (5), electric power supplied to a bottom heater (19) is fixed, and a magnetic field produced by a magnet (20) is applied to the melt (5). Electric power supplied to a main heater (9) is controlled so that the temperature at the surface of the melt (5) which the seed crystal (14) comes into contact with may be a target value. After the seed crystal (14) comes into contact with the melt (5), single crystal silicon is pulled up without performing a necking process.

7 Claims, 7 Drawing Sheets

FOREIGN PATENT DOCUMENTS

| | | |
|---|---|---|
| JP | 11-302096 | 11/1999 |
| JP | 2001-240493 | 9/2001 |
| JP | 2003-002782 | 1/2003 |
| JP | 2004-043252 | 2/2004 |
| WO | WO 01/63026 | 8/2001 |

| TEST NO. | (1) | (2) | (3) | (4) | (5) | (6) |
|---|---|---|---|---|---|---|
| MAGNET FIELD STRENGTH (Gauss) | 0 | 0 | 0 | 3000 | 3000 | 3000 |
| ELECTRIC POWER APPLIED TO BOTTOM HEATER (Kw) | 35 | 10 | 0 | 35 | 10 | 0 |
| ELECTRIC POWER APPLIED TO MAIN HEATER (Kw) | 105 | 120 | 138 | 112 | 126 | 143 |
| TEMPERATURE DIFFERENCE BETWEEN SEED CRYSTAL AND MELT ΔT (°C) | 111.1 | 103.2 | 95.6 | 92.2 | 82.5 | 78.5 |
| RESULT (WITHOUT DISLOCATION:○, WITH DISLOCATION:✕) | ✕ | ✕ | ○ | ○ | ○ | ○ |

| ELEMENTS | CONCENTRATION (atoms/cc) |
|---|---|
| B | $\geq$1e18 |
| Ga | $\geq$5e19 |
| In | $\geq$1e16 |
| P | $\geq$1e19 |
| As | $\geq$5e19 |
| Sb | $\geq$1e19 |
| Ge | $\geq$5e19 |
| N | $\geq$5e13 |
| C | $\geq$8e16 |

SINGLE CRYSTAL SEMICONDUCTOR MANUFACTURING APPARATUS AND METHOD

This application is a 371 of PCT/JP05/01937 Feb. 9, 2005.

TECHNICAL FIELD

The present invention relates to an apparatus and method capable of manufacturing a large-diameter, heavy single crystal semiconductor without dislocations when a single crystal semiconductor such as single crystal silicon is manufactured by a CZ method (Czochralski method).

BACKGROUND ART

The CZ method is one of the methods for manufacturing single crystal silicon.

One of unavoidable problems when the single crystal silicon is grown by the CZ method is "dislocation" which occurs at a solid-liquid interface of a seed crystal when the seed crystal comes into contact with a melt. The dislocation is generated by thermal stress induced within the seed crystal when the seed crystal comes into contact with the melt.

Figure 7:
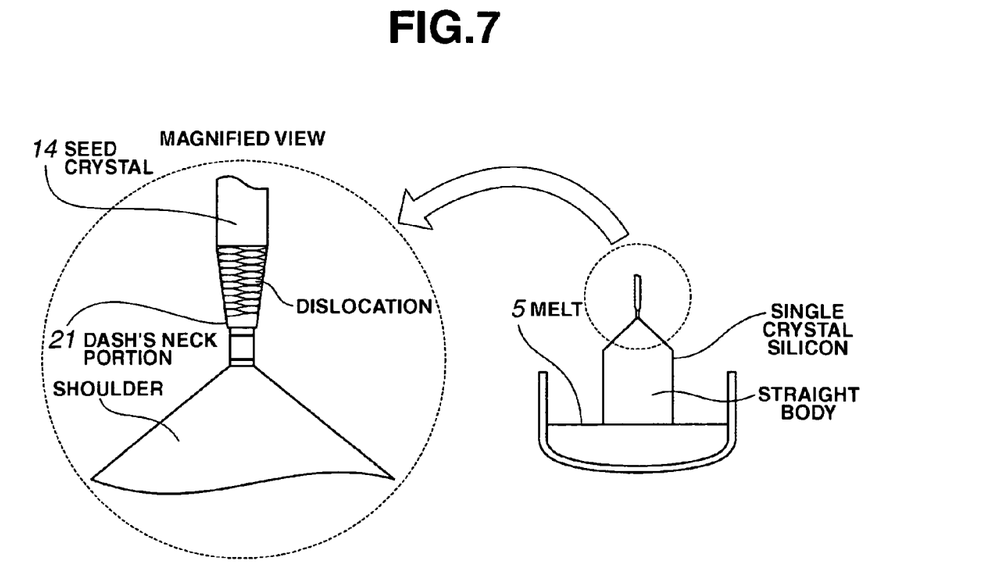
FIG. 7 is a diagram showing a Dash's neck portion.

To eliminate the dislocation from the crystal, a so-called Dash neck is required to decrease a crystal diameter to 3-4 mm. FIG. 7 shows a state that a Dash's neck portion 21 having a crystal diameter of 3-4 mm is formed to eliminate the dislocation from the crystal.

There are demands for the manufacture of a large-diameter silicon wafer having a diameter of 300 mm or more in these years, and it is required that a large-diameter, heavy single crystal silicon ingot can be pulled up without any problem. When the neck portion is decreased to a diameter of about 3-4 mm by the necking process, the dislocation is eliminated but the diameter is so thin that there is a possibility that it is impossible to manufacture a large-diameter, heavy single crystal silicon ingot without a problem such as falling of the crystal or the like.

(Prior Art 1)

Patent Literature 1 described later describes an invention that uses a silicon seed crystal with boron B added as an impurity at a high concentration and pulls up a large-diameter, heavy single crystal silicon ingot in a dislocation-free state without performing the necking process.

But, a parameter for suppressing the dislocation caused in the seed crystal is not limited to a concentration of impurity (boron B) added to the seed crystal.

Patent Literature 1:
Japanese Patent Application Laid-Open No 2001-240493

DISCLOSURE OF THE INVENTION

Problems to be Solved by the Invention

The present invention has found a new parameter for suppressing the dislocation from being caused in the seed crystal and provides an easy way of pulling up in a dislocation-free state without performing the necking process.

Means for Solving the Problems

A first aspect of the invention is a single crystal semiconductor manufacturing apparatus for manufacturing a single crystal semiconductor by heating a melt in a crucible by heating means, contacting an impurity-added seed crystal with the melt, and pulling up the seed crystal, wherein:
the melt is adjusted by the heating means and a magnetic field is applied to the melt so that, when the seed crystal is contacted with the melt, a temperature difference between the seed crystal and the melt becomes not larger than an allowable temperature difference not causing dislocation in the seed crystal.

A second aspect of the invention is a single crystal semiconductor manufacturing apparatus for manufacturing a single crystal semiconductor by heating a melt in a crucible by heating means, contacting an impurity-added seed crystal with the melt, and pulling up the seed crystal, wherein:
a plurality of adjusting means for independently adjusting an amount of heat applied to the crucible are disposed outside of the crucible, and
the melt is adjusted by the plurality of adjusting means and a magnetic field is applied to the melt so that, when the seed crystal is contacted with the melt, a temperature difference between the seed crystal and the melt becomes not larger than an allowable temperature difference not causing dislocation in the seed crystal.

A third aspect of the invention is the single crystal semiconductor manufacturing apparatus according to the first or the second aspect of the invention, wherein the allowable temperature difference not causing dislocation in the seed crystal is determined according to an impurity concentration added to the seed crystal and a size of the seed crystal.

A fourth aspect of the invention is the single crystal semiconductor manufacturing apparatus according to the second aspect of the invention, wherein among the plurality of adjusting means, at least the heating means at the bottom side of the crucible provides an invariable or substantially invariable heating amount when the seed crystal is contacted with the melt and an invariable or substantially invariable heating amount when the single crystal semiconductor is being pulled up.

A fifth aspect of the invention is a single crystal semiconductor manufacturing method for manufacturing a single crystal semiconductor by heating a melt in a crucible, contacting an impurity-added seed crystal with the melt, and pulling up the seed crystal, wherein:
the melt is heated and a magnetic field is applied to the melt so that, when the seed crystal is contacted with the melt, a temperature difference between the seed crystal and the melt becomes not larger than an allowable temperature difference not causing dislocation in the seed crystal.

A sixth aspect of the invention is the single crystal semiconductor manufacturing method according to the fifth aspect of the invention, wherein the allowable temperature difference not causing dislocation in the seed crystal is determined according to an impurity concentration added to the seed crystal and a size of the seed crystal.

Figure 3:
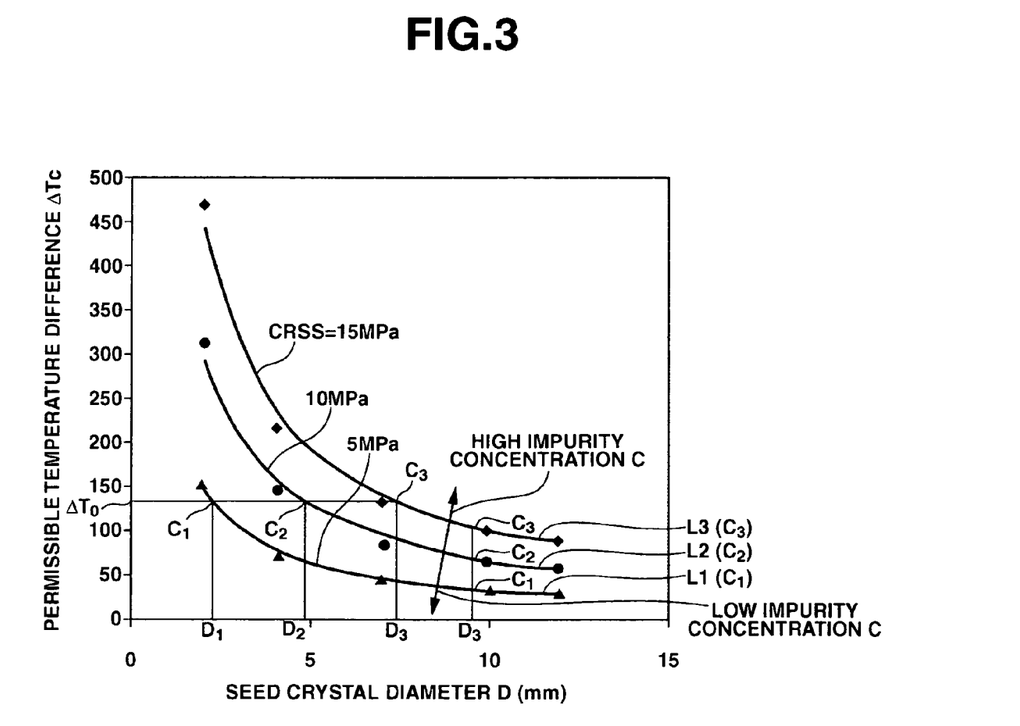
FIG. 3 is a graph showing a relationship among a seed crystal diameter, impurity concentration in a seed crystal and an allowable temperature difference.

The second and the fourth aspects of the invention use a silicon seed crystal 14 having a diameter of 7 mm with an impurity, for example, boron B of 5e18 atoms/cc added. As shown in FIG. 3, an allowable temperature difference ΔTc (allowable temperature difference ΔTc of 100° C.) not causing dislocation in the seed crystal is determined on the basis of a concentration C of an impurity added to the seed crystal 14 and a size (diameter D) of the seed crystal 14.

Where the seed crystal 14 comes into contact with a melt 5, electric power applied to a bottom heater 19 is fixed to 35 Kw, and a magnetic field (horizontal magnetic field) having a magnetic field strength of 3000 (Gauss) is applied to the melt 5 by a magnet 20. And, electric power applied to a main heater 9 is controlled by a closed loop control system so that the surface of the melt 5 with which the seed crystal 14 comes into contact has a target temperature (e.g., 1340° C.). Therefore, the electric power (Kw) applied to the bottom heater 19 and the electric power (Kw) applied to the main heater 9 are 35 (Kw) and 112 (Kw) (test (4) of FIG. 4), and a temperature difference ΔT between the seed crystal 14 and the melt 5 when they are contacted has a value (92.2° C.) not larger than the allowable temperature difference ΔTc (100° C.). As a result, the generation of dislocation in the seed crystal 14 is suppressed.

And, after the seed crystal 14 is contacted with the melt 5, the single crystal silicon is pulled up without performing the necking process.

After the seed crystal is contacted with the melt, the electric power applied to the main heater 9 is controlled so that the electric power (Kw) applied to the bottom heater 19 is kept at the same power of 35 (Kw) as that applied when contacting with the melt and a temperature of the melt 5 becomes a target temperature when the single crystal silicon is being pulled up. And, the magnetic field having a magnetic field strength of 3000 (Gauss) is continuously applied to the melt 5.

As a result, dislocation-free single crystal silicon is grown without performing the necking process.

As described above, the present invention has found a parameter to suppress a dislocation which might be caused in the seed crystal other than the concentration of the impurities of the seed crystal. Thus, it has become possible to pull up more easily in a dislocation-free state without performing the necking process.

In other words, the single crystal silicon to be pulled up is free from the dislocation with the electric power applied to the bottom heater 19 invariable or substantially invariable when and after the seed crystal is contacted with the melt, so that the heater adjusting work is simplified, and a burden placed on the operator is reduced. And, according to the present invention, the single crystal silicon to be pulled up is realized to be free from dislocation with the power applied to the bottom heater 19 kept at a high value (35 Kw) of a prescribed level or higher when and after the seed crystal is contacted with the melt, so that the single crystal silicon being pulled up can be prevented from having a large change in its diameter by increasing the electric power applied to the bottom heater 19 after the seed crystal is contacted with the melt.

According to the first, the third, the fifth and the sixth aspects of the invention, the concept of the heating means includes a single heating means which is not plural heating means.

According to the present invention, the single crystal silicon to be pulled up is realized to be free from dislocation with the electric power applied to a (single) heater invariable or substantially invariable when and after the seed crystal is contacted with the melt, so that the heater adjusting work is simplified, and a burden placed on the operator is reduced.

Figure 8:
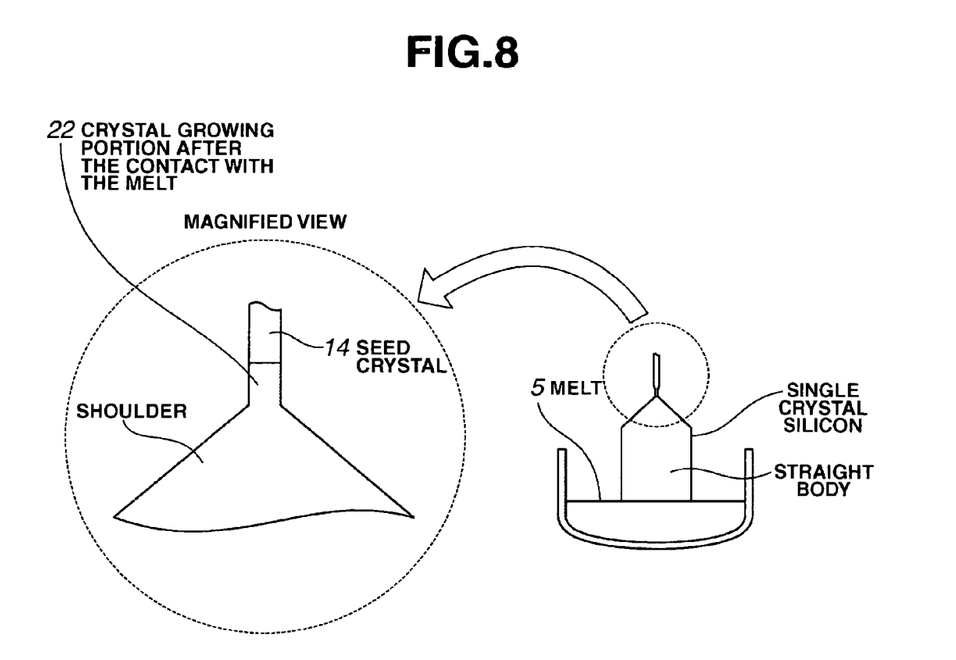
FIG. 8 is a diagram showing a crystal growing portion after contacting with the melt.

According to the present invention, the Dash neck is unnecessary, so that after the seed crystal is contacted with the melt, the procedure may be immediately shifted to a so-called shoulder forming step that pulls up while gradually increasing the diameter, or a crystal growing portion 22 (e.g., a length of about 50 mm) may be pulled up with a substantially fixed diameter after the contact with the melt as shown in FIG. 8, and the procedure may be shifted to the shoulder forming step after checking that the melt temperature is appropriate.

BEST MODE FOR CARRYING OUT THE INVENTION

The apparatus according to the embodiments will be described with reference to the figures.

Figure 1:
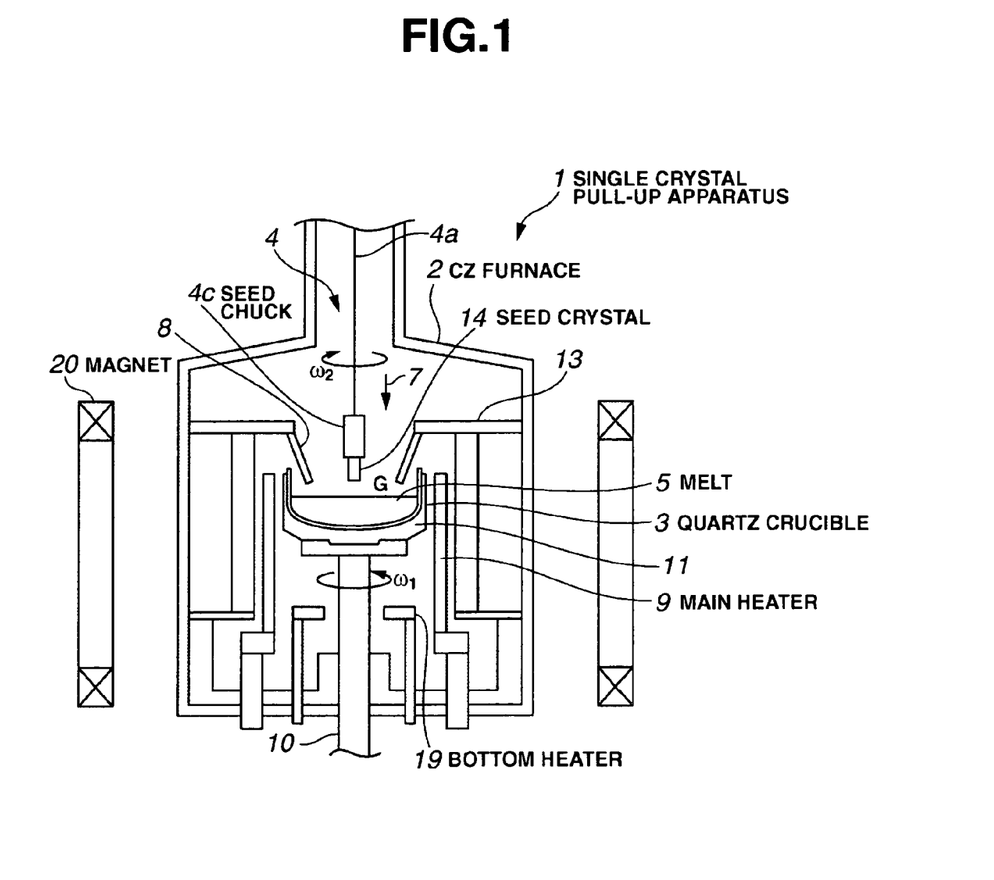
FIG. 1 is a diagram showing a single crystal pull-up apparatus of an embodiment.

FIG. 1 is a diagram showing a side view of a structure of an embodiment.

As shown in FIG. 1, a single crystal pull-up apparatus 1 of the embodiment has a CZ furnace (chamber) 2 as a single crystal pull-up vessel. The single crystal pull-up apparatus 1 of FIG. 1 is an apparatus suitable for manufacturing a large-diameter (e.g., a diameter of 300 mm), heavy single crystal silicon ingot.

The CZ furnace 2 has therein a quartz crucible 3 for melting Polycrystalline silicon material and accommodating a melt 5. About 300 kg of Polycrystalline silicon is charged into the quartz crucible 3 to pull up single crystal silicon having a diameter of 300 mm. The exterior of the quartz crucible 3 is covered with a graphite crucible 11. A cylindrical main heater 9 is disposed outside of the quartz crucible 3 to surround its side wall and heats to melt the Polycrystalline silicon material in the quartz crucible 3. A ring shape bottom heater 19 is disposed at the bottom of the quartz crucible 3 to auxiliary heat the bottom of the quartz crucible in order to prevent the melt 5 from curing on the bottom of the quartz crucible 3. The main heater 9 and the bottom heater 19 are independently controlled their output (power: kW) to adjust independently an amount of heat applied to the melt 5. For example, a temperature of the melt 5 is detected, the detected temperature is determined as a feedback amount, and individual outputs of the main heater 9 and the bottom heater 19 are controlled such that the temperature of the melt 5 becomes a target temperature.

The melt 5 is externally heated by the heaters 9, 19 in the embodiment, but the heating means is not limited to the heaters, but any type of heating means may be used. For example, a method of electromagnetic heating, or heating by laser irradiation may be adopted.

A heat-retaining tube 13 is disposed between the main heater 9 and the inner wall of the CZ furnace 2.

A pull-up mechanism 4 is disposed above the quartz crucible 3. The pull-up mechanism 4 includes a pull-up shaft 4a and a seed chuck 4c at an end of the pull-up shaft 4a. The seed crystal 14 is held by the seed chuck 4c. Here, the pull-up shaft 4a is, for example, a shaft or a wire, and the shaft is used for pulling up or the wire is used for winding up.

Polycrystalline silicon (Si) is heated to melt in the quartz crucible 3. When the temperature of the melt 5 stabilizes, the pull-up mechanism 4 operates to pull up a single crystal silicon (single crystal silicon ingot) from the melt 5. In other words, the pull-up shaft 4a is lowered, and the seed crystal 14 which is held by the seed chuck 4c at the end of the pull-up shaft 4a is dipped in the melt 5. After the seed crystal 14 is dipped in the melt 5, the pull-up shaft 4a rises. The single crystal silicon grows as the seed crystal 14 held by the seed chuck 4c is pulled up. The quartz crucible 3 being pulled up is rotated by a rotation shaft 10 at a rotation speed ω1. And, the pull-up shaft 4a of the pull-up mechanism 4 is rotated in a direction opposite to or same as that of the rotation shaft 10 at a rotation speed ω2.

The rotation shaft 10 can also be driven in a vertical direction, and the quartz crucible 3 can be moved vertically to a desired position.

The interior of the CZ furnace 2 is sealed from the outside air, so that the interior of the furnace 2 is kept under vacuum (e.g., about 20 Torr). In other words, argon gas 7 is supplied as an inert gas into the CZ furnace 2 and exhausted through an exhaust port of the CZ furnace 2 by a pump. Thus, the interior of the furnace 2 is decreased to a prescribed pressure.

Various types of vaporized materials are produced within the CZ furnace 2 during the single crystal pull-up process (1 batch). Accordingly, the argon gas 7 is supplied to the CZ furnace 2 and exhausted together with the vaporized materials from the CZ furnace 2 to clean the CZ furnace 2 by removing the vaporized materials. A supply flow rate of the argon gas 7 is set for each step in one batch.

The melt 5 decreases as the single crystal silicon is pulled up. When the melt 5 decreases, the contact area between the melt 5 and the quartz crucible 3 changes, and an amount of oxygen dissolved from the quartz crucible 3 changes. This change has an effect on the oxygen concentration distribution in the single crystal silicon being pulled up. Therefore, to prevent it, the Polycrystalline silicon material or the single crystal silicon material may be further supplied into the quartz crucible 3 having the decreased melt 5 after or during the pull up.

A thermal shielding plate 8 (gas-rectifying tube) having an approximate inverted truncated cone shape is disposed above the quartz crucible 3 and around the single crystal silicon. The thermal shielding plate 8 is supported by the heat-retaining tube 13. The thermal shielding plate 8 guides the argon gas 7 as the carrier gas being supplied from above into the CZ furnace 2 to the center of melt surface 5a, and to the peripheral edge of the melt surface 5a through the melt surface 5a. And, the argon gas 7 is exhausted together with gas vaporized from the melt 5 through an exhaust port formed at a lower part of the CZ furnace 2. Therefore, a gas flow rate on the melt surface can be stabilized, and oxygen vaporized from the melt 5 can be kept in a stable state.

And, the thermal shielding plate 8 insulates and shields the seed crystal 14 and the single crystal silicon grown by the seed crystal 14 from radiant heat produced from the high-temperature portions such as the quartz crucible 3, the melt 5 and the main heater 9. The thermal shielding plate 8 prevents the growth of the single crystal from being disturbed because of the adhesion of impurities (e.g., silicon oxide) and the like produced in the furnace to the single crystal silicon. A gap G between the bottom end of the thermal shielding plate 8 and the melt surface 5a can be adjusted by vertically moving the rotation shaft 10 to change the vertical position of the quartz crucible 3. The gap G may also be adjusted by vertically moving the thermal shielding plate 8 by a lifting device.

A magnet 20 is disposed outside and around the CZ furnace 2 to apply a magnetic field (horizontal magnetic field) to the melt 5 in the quartz crucible 3.

Figure 2:
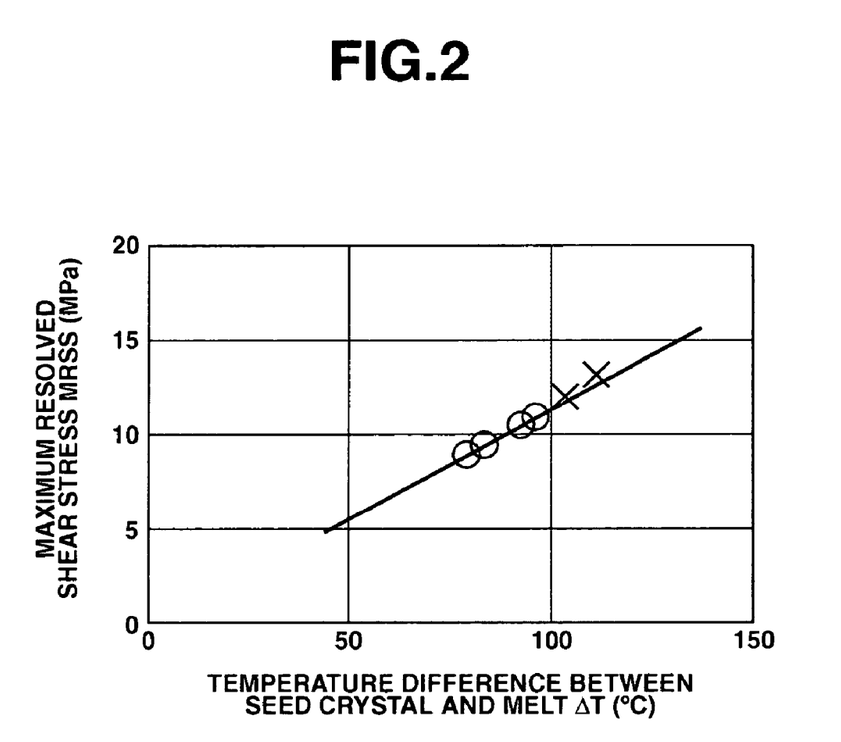
FIG. 2 is a graph showing a relationship between a temperature difference between a seed crystal and a melt and a maximum resolved shear stress.

FIG. 2 shows a relationship between a temperature difference ΔT (° C.) between a leading end surface of the seed crystal 14 and the melt 5 (melt surface) when the seed crystal 14 comes into contact with the melt 5 and the maximum resolved shear stress MRSS (MPa) in the seed crystal 14. Here, the maximum resolved shear stress MRSS (MPa) in the seed crystal 14 indicates an index which is a maximum value of a thermal stress applied to the seed crystal 14 at the time of contact with the melt 5 and at which a dislocation is caused in the seed crystal 14 by thermal shock. FIG. 2 shows a plot of the temperature difference ΔT calculated by a total heat-transmission analyzing program (FEMAG) and the maximum resolved shear stress MRSS calculated by stress analysis (FEMAG).

As shown in FIG. 2, the maximum resolved shear stress MRSS in the seed crystal 14 decreases as the temperature difference ΔT becomes small, and it becomes hard that a dislocation due to thermal shock is caused in the seed crystal 14.

Meanwhile, the present inventors have filed a patent application that an allowable temperature difference (thermal stress) not causing dislocation in the seed crystal is previously determined based on the concentration of an impurity added to a seed crystal and a size of the seed crystal, and power of a heater outside of a crucible is adjusted so that a temperature difference between the seed crystal and a melt becomes not larger than the allowable temperature difference when the seed crystal is contacted with the melt (Japanese Patent Application No. 2002-204178). This patent application No. 2002-204178 discloses a relationship among a concentration C of an impurity (e.g., boron B) added to a seed crystal 14, a size (diameter D) of the seed crystal 14, a critical resolved shear stress (CRSS: MPa), and an allowable temperature difference ΔTc.

Specifically, FIG. 3 shows a corresponding relation between the diameter D and the allowable temperature difference ΔTc as characteristics L1, L2, L3 with the diameter D (mm) of the seed crystal 14 represented on the horizontal axis and an allowable temperature difference ΔTc between a temperature of the leading end of the seed crystal 14 and a temperature of the melt 5 (melt surface) at the time of the contact with the melt represented on the vertical axis. As indicated by the characteristics L1, L2, L3, the seed crystal diameter D and the allowable temperature difference ΔTc have a relation of substantially inverse proportion. In other words, with the seed crystal diameter D increasing, thermal shock stress to be applied to the seed crystal 14 at the time of the contact with the melt increases, and it is necessary to decrease the allowable temperature difference ΔTc accordingly.

Here, the allowable temperature difference ΔTc is a maximum temperature difference not causing dislocation in the seed crystal 14.

The characteristics L1, L2, L3 represent differences in magnitude of the critical resolved shear stress (CRSS: MPa) which is one of indexes of the mechanical strength of the seed crystal 14. The critical resolved shear stress (CRSS) is a critical stress over which dislocation is caused in the seed crystal 14. In the figure, the characteristic L1 indicates that the critical resolved shear stress (CRSS) is smallest (5 MPa), the characteristic L2 indicates that the critical resolved shear stress (CRSS) (10 MPa) is larger than that of the characteristic L1, and the characteristic L3 indicates that the critical resolved shear stress (CRSS) is largest (15 MPa).

The critical resolved shear stress (CRSS) is variable depending on the type and concentration C of the impurity added to the seed crystal 14. In this embodiment, boron B is assumed as a type of the impurity.

With the concentration C of the impurity added to the seed crystal 14 increasing, the critical resolved shear stress (CRSS) increases. With the concentration C of the impurity added to the seed crystal 14 increasing in order of C1, C2, C3, the characteristics vary as indicated by L1, L2, L3. In FIG. 3, the concentration C of the impurity represents the three types, but the characteristics are variable in multiple stages or continuously as the concentration C of the impurity changes in more multiple stages or continuously.

Therefore, when diameter D of the seed crystal 14 is, for example, the same value D'3, the characteristics vary as indicated by L1, L2, L3 with the impurity concentration C increasing as indicated by C1, C2, C3, so that the allowable temperature difference ΔTc increases. And, if the allowable temperature difference ΔTc is, for example, the same value ΔTc0, the characteristics vary as indicated by L1, L2, L3 with the diameter D of the seed crystal 14 increasing as indicated by D1, D2, D3, so that the impurity concentration C may be increased as indicated by C1, C2, C3.

The impurity of boron B was described above, but the same relationship can be established in a case where various types of impurities such as germanium Ge, indium In and the like other than the boron B are added to the seed crystal 14.

Therefore, where a prescribed concentration C is added to the seed crystal 14 and a size (diameter) of the seed crystal 14 has a prescribed value D, the allowable temperature difference ΔTc can be determined from the characteristics L1, L2, L3 shown in FIG. 3, and a dislocation can be prevented from being caused in the seed crystal 14 without performing the necking process by adjusting the electric power of the individual heaters 9, 19 so that the temperature difference ΔT between the seed crystal 14 and the melt 5 at the time of the contact with the melt becomes not larger than the allowable temperature difference ΔTc.

For the silicon seed crystal 14 having a diameter of 7 mm to which the impurity boron B is added in 5e18 atoms/cc, if the power of the individual heaters 9, 19 can be adjusted so that the allowable temperature difference ΔTc becomes 100° C. and the temperature difference ΔT between the seed crystal 14 and the melt 5 at the time of the contact with the melt becomes not larger than the allowable temperature difference ΔTc (100° C.), a dislocation-free single crystal can be obtained stably without performing the necking process.

Figure 4:
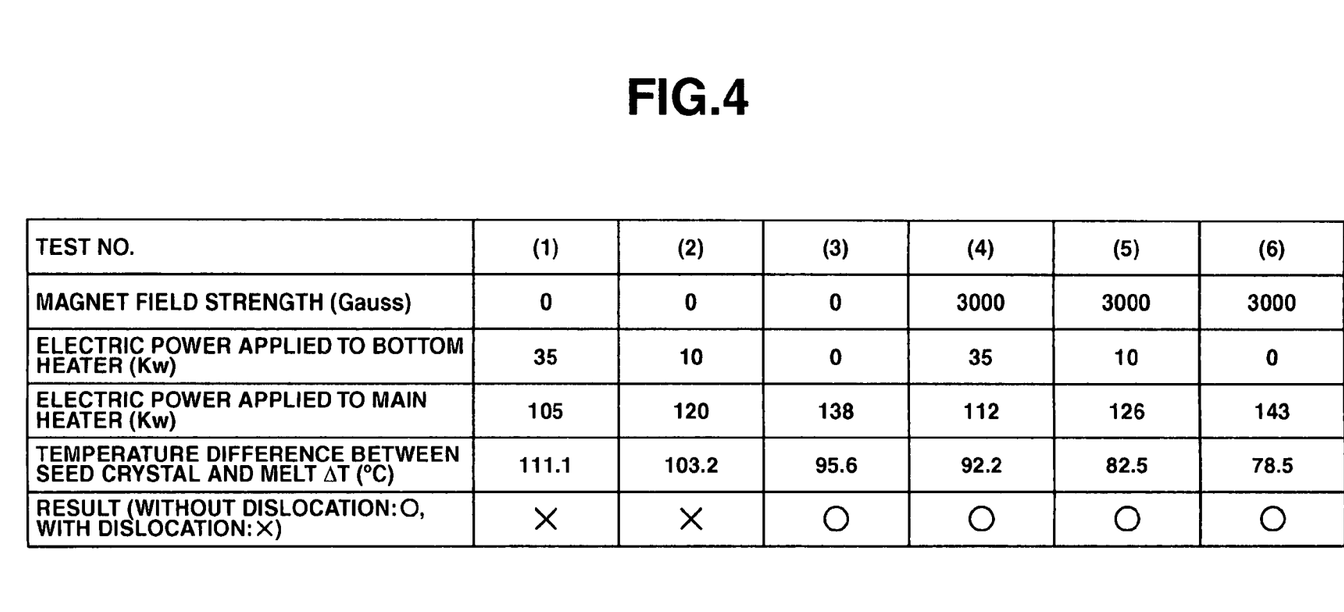
FIG. 4 is a table showing the results of an experiment performed in order to compare between cases with and without application of a magnetic field to a melt.

FIG. 4 shows the results of an experiment performed on the influence of a magnetic field, which is applied to the melt 5, upon the above temperature difference ΔT. In the experiment, the silicon seed crystal 14 having a diameter of 7 mm to which 5e18 atoms/cc of the impurity boron B was added (allowable temperature difference ΔTc was 100° C.) was used, and tests (1)-(6) were performed with electric power (Kw) applied to the bottom heater 19 and electric power (Kw) applied to the main heater 9 changed variously when the silicon seed crystal 14 was contacted with the melt 5. It was checked whether or not a dislocation was caused in the silicon seed crystal 14 between a case where a magnetic field having magnetic field strength of 3000 (Gauss) was applied to the melt 5 by the magnet 20 (tests (4)-(6)) and a case where the magnetic field was not applied (tests (1)-(3)). In FIG. 4, symbol × indicates that the dislocation was caused in the seed crystal 14, and the single crystal silicon had the dislocation, and symbol ○ indicates that the dislocation was not caused in the seed crystal 14 and the single crystal silicon was free from the dislocation. In the experiment, 300 kg of Polycrystalline silicon was charged, and the single crystal silicon having a diameter of 300 mm was pulled up. In the experiment, electric power applied to the bottom heater 19 was fixed to individual values (0 Kw, 10 Kw, 35 Kw), and electric power applied to the main heater 9 was controlled by a closed loop control system so that the surface of the melt 5 with which the seed crystal 14 was contacted had a target temperature (e.g., 1340° C.).

As shown in FIG. 4, in a case where a magnetic field was not applied to the melt 5 (tests (1)-(3)), only the test (3) in which the electric power applied to the bottom heater 19 was adjusted to 0 (Kw) and the electric power applied to the main heater 9 was adjusted to 138 (Kw) had a temperature difference of 95.6 (° C.) which was not larger than the allowable temperature difference ΔTc (100° C.), and the elimination of dislocation was confirmed, but the tests (1), (2) in which the electric power applied to the bottom heater 9 was set to values (10 Kw, 35 Kw) higher than 0 Kw had temperature differences (111.1° C., 103.2° C.) exceeding the allowable temperature difference ΔTc, and the generation of a dislocation was confirmed.

Meanwhile, in a case where a magnetic field was applied to the melt 5 (tests (4)-(6)), temperature differences (92.2° C., 82.5° C., 78.5° C.) not larger than the allowable temperature difference ΔTc (100° C.) were obtained regardless of the application of the electric power to the bottom heater 19 and the main heater 9 (applied electric power ratio), and no generation of dislocation at all test levels was confirmed. Especially, in tests that the electric power applied to the bottom heater 9 was set to values (10 Kw, 35 Kw) higher than 0 Kw, a difference was confirmed that the dislocation was generated when the magnetic field was not applied, while no dislocation was generated when the magnetic field was applied. FIG. 2 shows a plot of the dislocation-free (symbol ○) and the generation of dislocation (symbol ×) shown in FIG. 4.

The reason why the dislocation-free is easily realized by the application of a magnetic field to the melt 5 regardless of the application of the electric power to the heater described above is explained as follows.

Specifically, the application of the magnetic field to the melt 5 suppresses convection within the melt 5. Therefore, thermal conduction in the melt 5 is suppressed, the temperature difference of the melt 5 in the horizontal direction in FIG. 1 increases, and a temperature of a portion (melt surface) of the melt 5 with which the seed crystal 14 is contacted decreases. Thus, to keep the target temperature of the contact surface of the melt 5, the electric power applied to the main heater 9 is increased. When the electric power applied to the main heater 9 is increased, the radiant heat increases, and the temperature of the seed crystal 14 increases. And, the temperature of the seed crystal 14 becomes closer to the temperature of the melt 5 (higher than the temperature of the seed crystal 14), and the temperature difference ΔT decreases. Thus, the maximum resolved shear stress MRSS (MPa) in the seed crystal 14, namely the maximum value of the thermal stress involved in the contact with the melt, decreases, and the dislocation is caused with further difficulty.

It is desirable that the strength of the magnetic field applied to the melt 5 is 1500 (Gauss) or more. It is because when the magnetic field strength is in a range of 1000 to 1500 (Gauss), an instable portion where the temperature varies considerably appears in the melt 5, causing a possibility of a defect that the crystal diameter is varied, and when it is 1000 (Gauss) or less, a convection suppressing effect is low, and controllability of the crystal diameter becomes inferior.

EXAMPLE 1

Example 1 based on the results of the tests shown in FIG. 4 will be described.

In Example 1, the silicon seed crystal 14 having a diameter of 7 mm to which 5e18 atoms/cc of the impurity boron B was added was used (an allowable temperature difference $\Delta Tc$ of 100° C.). Electric power applied to the bottom heater 19 was fixed to 35 Kw when the seed crystal 14 was contacted with the melt 5, and a magnetic field (horizontal magnetic field) having magnetic field strength of 3000 (Gauss) was applied to the melt 5 by the magnet 20. And, electric power applied to the main heater 9 was controlled by a closed loop control system so that a contact surface of the melt 5 with which the seed crystal 14 was contacted had a target temperature (e.g., 1340° C.). Therefore, the electric power (Kw) applied to the bottom heater 19 and the electric power (Kw) applied to the main heater 9 were 35 (Kw) and 112 (Kw) respectively in the same manner as in the test (4) shown in FIG. 4, a temperature difference $\Delta T$ between the seed crystal 14 and the melt 5 at the time of the contact with the melt had a value (92.2° C.) of not more than the allowable temperature difference $\Delta Tc$ (100° C.), and the generation of dislocation in the seed crystal 14 was suppressed.

And, after the seed crystal 14 was contacted with the melt 5, the single crystal silicon was pulled up without performing the necking process. After the seed crystal was contacted with the melt, the electric power (Kw) applied to the bottom heater 19 was kept at the same electric power 35 (Kw) as that at the time of the contact with the melt during the single crystal silicon was being pulled up, and the electric power applied to the main heater 9 was controlled so that the temperature of the melt 5 became the target temperature. And, the magnetic field having the same magnetic field strength 3000 (Gauss) was continuously applied to the melt 5. In other words, the strength of the magnetic field applied when the seed crystal 14 was contacted with the melt 5 was the same as that of the magnetic field applied at the time of the growth of the single crystal.

As a result, the single crystal silicon not having dislocation could be grown without performing the necking process.

According to this example, a Dash neck is unnecessary, so that after the seed crystal is contacted with the melt, the procedure may be immediately shifted to a so-called shoulder forming step that pulls up while gradually increasing a diameter, or the crystal growing portion 22 (e.g., a length of about 50 mm) may be pulled up with a substantially fixed diameter after the contact with the melt as shown in FIG. 8, and it may be checked that the melt temperature is appropriate before the procedure is shifted to the shoulder forming step. It is desirable that the crystal growing portion 22 has a diameter (minimum crystal diameter) of 4 mm or more.

According to this example, the single crystal silicon pulled up can be realized to be free from dislocation without changing the electric power applied to the bottom heater 19 when and after the seed crystal is contacted with the melt. Therefore, the heater adjusting work can be simplified, and a burden placed on the operator can be decreased. And, according to this example, the single crystal silicon pulled up can be realized to be free from dislocation with the electric power applied to the bottom heater 19 kept at a high value (35 Kw) higher than a prescribed level when and after the seed crystal is contacted with the melt. Therefore, the diameter of the single crystal silicon pulled up can be avoided from varying considerably by raising the electric power applied to the bottom heater 19 after the seed crystal is contacted with the melt.

According to this example, the environment can be made closer to a thermal environment in which a straight body portion is formed, so that a change in diameter or the generation of dislocation can be suppressed, the diameter of a neck portion (first part of the crystal growing portion) for supporting the crystal pulling does not become smaller than a target diameter, and the pulling can be prevented from becoming difficult due to insufficient strength.

When the seed crystal 14 is contacted with the melt 5, the thermal shielding plate 8 is raised by the above-described lifting device so that a larger amount of radiant heat may be applied to the seed crystal 5 to decrease the temperature difference $\Delta T$ furthermore.

And, it is desirable that a difference between the concentration of the impurity added to the seed crystal 14 and the concentration of the impurity in the melt 5 is decreased to a prescribed level or less so as to avoid the introduction of not only dislocation due to thermal shock but also dislocation (misfit dislocation) due to a lattice mismatch on the contact surfaces between the seed crystal 14 and the melt 5.

A type and concentration of the impurity to be added to the melt 5 are determined according to the specifications designated by a customer semiconductor device manufacturer. Specifically, impurity B has a specified concentration in a range of 5e14-2e19 atoms/cc, impurity P has a specified concentration in a range of 1e14-8e18 atoms/cc, impurity Sb has a specified concentration in a range of 2e17-1e19 atoms/cc, and impurity As has a specified concentration in a range of 5e18-1e20 atoms/cc.

To suppress the dislocation due to the lattice mismatch, it is desirable to use the seed crystal 14 which has the impurity type and added concentration adjusted in advance according to the impurity type and impurity concentration on the side of the melt 5, so that the bonded portion between the seed crystal 14 and the single crystal silicon has a lattice mismatch rate of 0.01% or less.

In this example, the strength of the magnetic field applied when the seed crystal 14 is contacted with the melt is the same as that of the magnetic field applied at the time of growing the single crystal, but the strength of the magnetic field applied when the seed crystal 14 is contacted with the melt 5 may be larger than that of the magnetic field applied when the single crystal is grown.

Example 1 was described assuming that the silicon seed crystal 14 had a diameter of 7 mm. But, when the silicon seed crystal has a diameter of 4 mm or more, a dislocation-free single crystal silicon can be grown in the same manner without performing the necking process. To pull up a single crystal silicon having a weight of more than 200 kg and a diameter of 300 mm, it is desirable that the silicon seed crystal 14 has a diameter of 5 mm or more.

EXAMPLE 2

Figure 5:
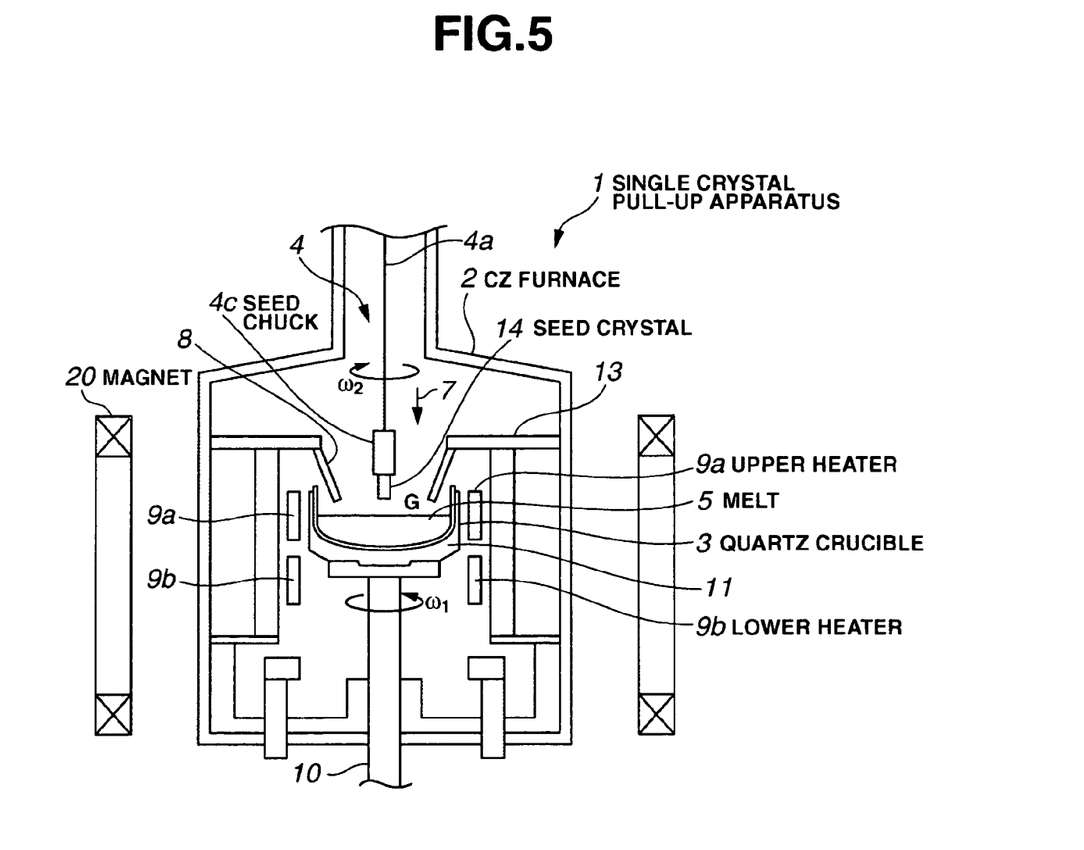
FIG. 5 is a diagram showing a single crystal pull-up apparatus different from that shown in FIG. 1.

The single crystal pull-up apparatus 1 shown in FIG. 5 may be used instead of the single crystal pull-up apparatus 1 of FIG. 1.

In the apparatus shown in FIG. 5, the bottom heater 19 is omitted, and the main heater 9 is divided into vertical two stages of heaters 9a, 9b along the vertical direction of the quartz crucible 3. The heaters 9a, 9b can independently adjust the amount of heat, namely power, to the quartz crucible 3. The apparatus of the Example has the heater 9 in the two divided stages, but it may be divided into three or more.

By the above-structured multi-heater, a dislocation-free single crystal silicon can be pulled up by applying a magnetic field to the melt 5 in the same manner as in Example 1 without performing the necking process while the electric power applied to the bottom-side (lower) heater 9b is kept at a high value (35 Kw) of the same fixed level or more when and after the seed crystal is contacted with the melt.

EXAMPLE 3

The above-described example was described assuming that the single crystal pull-up apparatus 1 was provided with a multi-heater. But, the elimination of dislocation can be realized easily by applying the magnetic field to the melt 5 in the same way even when the single crystal pull-up apparatus 1 is provided with a single heater.

Specifically, in a case where the bottom heater 19 is omitted and the main heater 9 only is provided in FIG. 1, dislocation-free single crystal silicon can be pulled up with the magnetic field applied to the melt 5 without performing the necking process, while the electric power applied to the heater 9 is kept at the same value or substantially the same value when and after the seed crystal is contacted with the melt. Therefore, the heater adjusting work is simplified, and a burden placed on the operator is decreased.

The impurity of boron B was described in the above Example. In a case where various types of impurities such as germanium Ge, indium In and the like other than the boron B are added to the seed crystal 14, the generation of dislocation in the seed crystal due to thermal shock can be suppressed in the same way and the single crystal silicon can be grown without dislocation.

Figure 6:
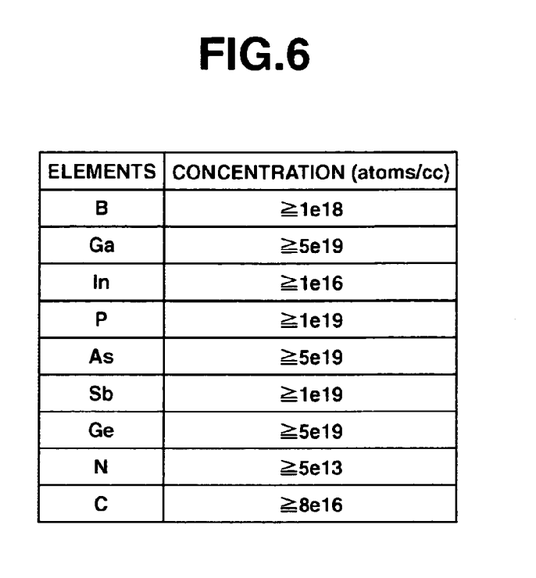
FIG. 6 is a table showing a relationship between various elements added to a seed crystal and a concentration range in which thermal shock dislocation is not caused.

FIG. 6 shows concentration ranges of various elements that suppress the generation of dislocation in the seed crystal due to thermal shock when added to the seed crystal 14. Specifically, impurity B may be added in 1e18 atoms/cc or more. It is because it was found by evaluating the interface between the seed crystal 14 and a newly formed crystal by contacting with the melt by X-rays after the pull up that there was no generation of dislocation when the impurity boron B was added in 1e18 atoms/cc or more to the seed crystal 14. And, impurity Ga may be added in 5e19 atoms/cc or more, impurity In may be added in 1e16 atoms/cc or more, impurity P may be added in 1e19 atoms/cc or more, impurity As may be added in 5e19 atoms/cc or more, impurity Sb may be added in 1e19 atoms/cc or more, impurity Ge may be added in 5e19 atoms/cc or more, impurity N may be added in 5e13 atoms/cc or more, and impurity C may be added in 8e16 atoms/cc or more.

It was described above to determine the allowable temperature difference $\Delta Tc$ assuming that the seed crystal 14 had a diameter D. But, the allowable temperature difference $\Delta Tc$ may be determined assuming that an area of the end surface of the seed crystal 14 is a size of the seed crystal 14.

The invention claimed is:

1. A single crystal semiconductor manufacturing apparatus for manufacturing a single crystal semiconductor by heating a melt in a crucible by heating means, contacting an impurity-added seed crystal with the melt, and pulling up the seed crystal, comprising the steps of:
   adjusting the temperature of the melt by the heating means and applying a horizontal magnetic field to the melt so that the seed crystal is heated by radiant heat and so that, when the seed crystal is contacted with the melt, a temperature difference between the seed crystal and the melt becomes not larger than an allowable temperature difference and does not cause dislocation in the seed crystal.

2. The single crystal semiconductor manufacturing apparatus according to claim 1, wherein the allowable temperature difference not causing dislocation in the seed crystal is determined according to an impurity concentration added to the seed crystal and a size of the seed crystal.

3. A single crystal semiconductor manufacturing apparatus for manufacturing a single crystal semiconductor by heating a melt in a crucible by heating means, contacting an impurity-added seed crystal with the melt, and pulling up the seed crystal, wherein:
   a plurality of adjusting means for independently adjusting an amount of heat applied to the crucible disposed, and
   the melt is adjusted by the plurality of adjusting means and a horizontal magnetic field is applied to the melt so that the seed crystal is heated by radiant heat and so that, when the seed crystal is contacted with the melt, a temperature difference between the seed crystal and the melt becomes not larger than an allowable temperature difference not causing dislocation in the seed crystal.

4. The single crystal semiconductor manufacturing apparatus according to claim 3, wherein among the plurality of adjusting means, at least the heating means at the bottom side of the crucible provides an invariable or substantially invariable heating amount when the seed crystal is contacted with the melt and an invariable or substantially invariable heating amount when the single crystal semiconductor is being pulled up.

5. A single crystal semiconductor manufacturing method for manufacturing a single crystal semiconductor by heating a melt in a crucible, contacting an impurity-added seed crystal with the melt, and pulling up the seed crystal, comprising the steps of:
   heating the melt and applying a horizontal magnetic field to the melt so that the seed crystal is heated by radiant heat and so that, when the seed crystal is contacted with the melt, a temperature difference between the seed crystal and the melt becomes not larger than an allowable temperature difference and does not cause dislocation in the seed crystal.

6. The single crystal semiconductor manufacturing method according to claim 5, wherein the allowable temperature difference not causing dislocation in the seed crystal is determined according to an impurity concentration added to the seed crystal and a size of the seed crystal.

7. A single crystal semiconductor manufacturing method for manufacturing a single crystal semiconductor by heating a melt in a crucible, contacting an impurity-added seed crystal with the melt and pulling up the seed crystal comprising the steps of:
   Heating the melt and applying a horizontal magnetic field to the melt before the seed crystal is contacted with the melt so that the seed crystal is heated by radiant heat and so that, when the seed crystal is contacted with the melt, a temperature difference between the seed crystal and the melt becomes not larger than an allowable temperature difference and does not cause dislocation in the seed crystal.

* * * * *